(12) United States Patent
Wagner et al.

(10) Patent No.: US 11,817,831 B2
(45) Date of Patent: Nov. 14, 2023

(54) SELECTIVELY SWITCHABLE WIDEBAND RF SUMMER

(71) Applicant: Northrop Grumman Systems Corporation, Falls Church, VA (US)

(72) Inventors: Eric C. Wagner, Redondo Beach, CA (US); Timothy R. LaRocca, Redondo Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 18/114,401

(22) Filed: Feb. 27, 2023

(65) Prior Publication Data

US 2023/0216455 A1 Jul. 6, 2023

Related U.S. Application Data

(63) Continuation of application No. 17/126,756, filed on Dec. 18, 2020, now Pat. No. 11,616,477.

(51) Int. Cl.
*H03F 1/56* (2006.01)
*H03F 3/72* (2006.01)
*H03F 3/195* (2006.01)

(52) U.S. Cl.
CPC ............ *H03F 3/195* (2013.01); *H03F 1/56* (2013.01); *H03F 3/72* (2013.01); *H03F 2200/451* (2013.01)

(58) Field of Classification Search
CPC .................................... H03F 1/56; H03F 3/72
USPC ......................................................... 330/51
See application file for complete search history.

(56) References Cited

U.S. PATENT DOCUMENTS

| 4,242,730 | A | * | 12/1980 | Golias | G01N 21/5907 346/33 A |
|---|---|---|---|---|---|
| 5,973,368 | A | * | 10/1999 | Pearce | H03F 3/217 257/337 |
| 2011/0043286 | A1 | * | 2/2011 | Youngblood | H03D 7/1458 330/124 R |
| 2013/0151175 | A1 | * | 6/2013 | Streit | G06F 17/00 702/58 |

(Continued)

*Primary Examiner* — Patricia T Nguyen
(74) *Attorney, Agent, or Firm* — MCCRACKEN & GILLEN LLC (57) ABSTRACT

A radio frequency (RF) summer circuit having a characteristic impedance $Z_0$ comprises first and second ports coupled by first and second resistances, respectively, to a junction. The circuit further comprises a series combination of a third resistance and a switch movable between open and closed positions and an amplifier having input and output terminals and operable in an off state and an on state wherein the series combination is coupled across the input and output terminals of the amplifier between the junction and a third port. The first resistance, second resistance, and the third resistance are all substantially equal to $Z_0/3$. Further, when the switch is moved to the closed position and the amplifier is switched to the off state a passive mode of operation is implemented and when the switch is moved to the open position and the amplifier is switched to the on state an active mode of operation is implemented. The RF summer circuit develops a summed signal at the third port equal to a sum of signals at the first and second ports modified by one of first and second gain values.

9 Claims, 6 Drawing Sheets

(56) References Cited

U.S. PATENT DOCUMENTS

| | | | | |
|---|---|---|---|---|
| 2014/0320207 A1* | 10/2014 | Huang | ............... | H03G 1/0023 |
| | | | | 330/254 |
| 2015/0381123 A1* | 12/2015 | Wu | ............... | H03F 1/342 |
| | | | | 330/282 |
| 2020/0099352 A1* | 3/2020 | Chandrakumar | ............... | A61B 5/24 |
| 2021/0265965 A1* | 8/2021 | Peng | ............... | H03F 3/245 |

* cited by examiner

SELECTIVELY SWITCHABLE WIDEBAND RF SUMMER

CROSS REFERENCE TO RELATED APPLICATION

The present application is a continuation application of U.S. patent application Ser. No. 17/126,756, now U.S. Pat. No. 11,616,477, filed Dec. 18, 2020, entitled "SELECTIVELY SWITCHABLE WIDEBAND RF SUMMER" the entire contents of which are incorporated herein by reference herein.

STATEMENT OF GOVERNMENT RIGHTS

The Government of the United States of America has rights in this invention pursuant to Government Contract Air Force Research Laboratory No. HQ072719F1429.

FIELD OF DISCLOSURE

The present subject matter relates to radio frequency (RF) devices, and more particularly, to a selectively switchable RF summer.

BACKGROUND

At times, it is necessary to control gain in an RF circuit. For example, an H-tree network may be used as an antenna feed for a phased-array RF device or an RF transversal filter. Signals in an H-tree network can either sum coherently, creating a large signal at an associated antenna feed output port that can result in the production of non-linear distortion at a device (e.g., an input amplifier) coupled to the output port, or can sum incoherently, resulting in a reduction in signal-to-noise ratio (SNR) at another associated output port, albeit at reduced gain. A circuit designer can provide one or more signals developed at a corresponding number of H-tree network output port(s) to a downstream device(s). It is often necessary to balance noise and linearity performance selectively at such port(s); however, it is difficult to obtain gain control without sacrificing matching and bandwidth.

A prior approach to solving the foregoing issue may comprise a resistive combiner with switched resistances, or a common variable gain amplifier topology. These prior approaches, however, are only capable of achieving a relatively low dynamic range improvement in an H-tree summer.

SUMMARY

According to one aspect, a radio frequency (RF) summer circuit having a characteristic impedance $Z_0$ comprises first and second ports coupled by first and second resistances, respectively, to a junction and further comprising a third port at which a summed signal is developed. A series combination of a third resistance and a switch is movable between open and closed positions and an amplifier has input and output terminals and is operable in an off state and an on state. The series combination has a first end coupled to the junction and to the input terminal and the series combination further has a second end coupled to the output terminal and the output terminal is further coupled to a third port. The first resistance, second resistance, and the third resistance are all substantially equal to $Z_0/3$. Further, when the switch is moved to the closed position and the amplifier is switched to the off state a passive mode of operation is implemented and when the switch is moved to the open position and the amplifier is switched to the on state an active mode of operation is implemented. The summed signal developed at the third port is equal to a sum of signals at the first and second ports modified by a first one of first and second gain values when the passive mode of operation is implemented and the summed signal is equal to a sum of signals at the first and second ports modified by a second one of the first and second gain values when the active mode of operation is implemented.

Other aspects and advantages will become apparent upon consideration of the following detailed description and the attached drawings wherein like numerals designate like structures throughout the specification.

DETAILED DESCRIPTION

Figure 1:
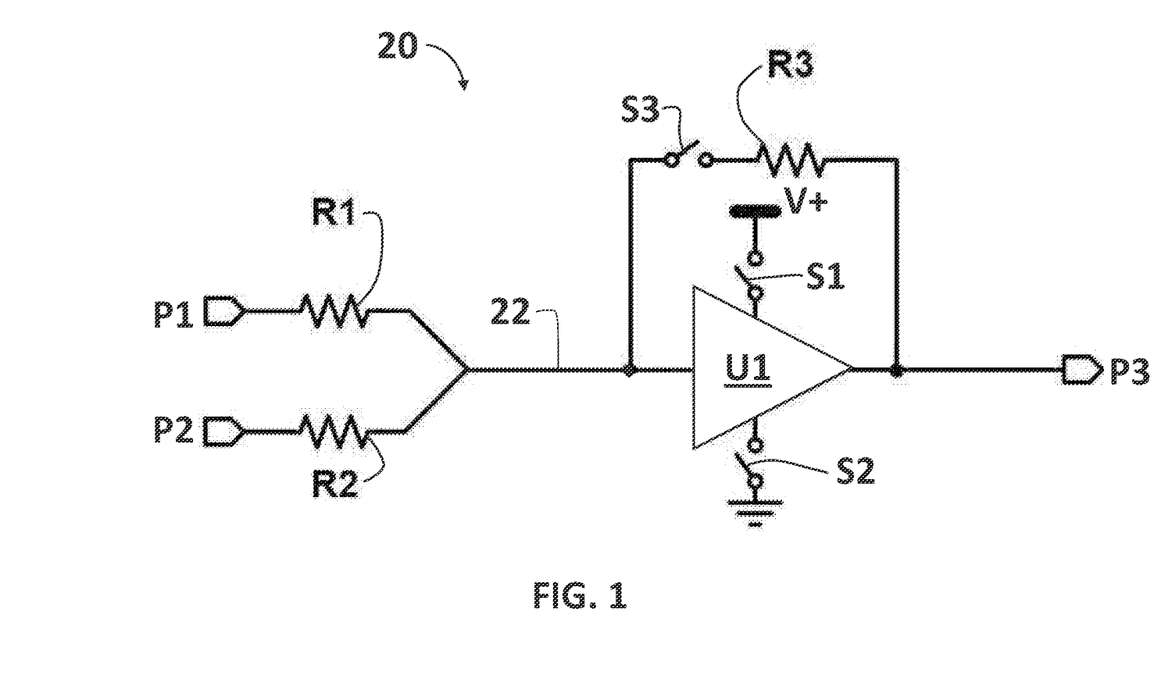
FIG. 1 is a simplified circuit diagram of an embodiment of a selectively switchable RF summer.

Referring first to FIG. 1, a selectively switchable wideband RF summer circuit 20 comprises a multi-port device comprising first, second, and third ports P1, P2, and P3, respectively. The first and second ports P1 and P2 are coupled by resistors R1 and R2, respectively, to a junction 22. A buffer amplifier U1 includes an input terminal coupled to the junction 22 and an output terminal coupled to the third port P3. The amplifier U1 includes power terminals coupled by first and second switches S1 and S2 to a supply voltage V+ and ground, respectively. A series combination of a third switch S3 and a third resistor R3 across the amplifier U1 between the junction 22 and the third port P3.

Each of the first, second, and third switches S1, S2, and S3 is selectively operable between open and closed positions and may comprise a manually and/or mechanically operable device, an electronically operable device (e.g., a transistor), or any other suitable device. Further, each of the first, second, and third resistors has a resistance related to a characteristic impedance $Z_0$ of the summer circuit 20. Specifically, in a preferred embodiment, the resistances of the resistors R1, R2, and R3 are the same and each is equal to $Z_0/3$. Thus, in a specific embodiment in which $Z_0$ is equal to 50 ohms, the resistances of R1, R2, and R3 are all equal to 50/3 (i.e., approximately 16.67) ohms.

Figure 2:
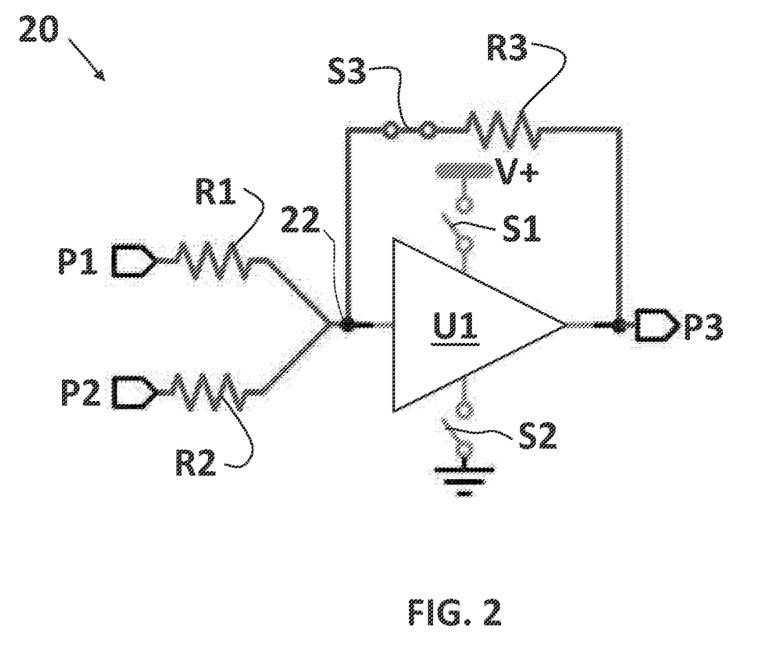
FIG. 2 is a simplified circuit diagram of the embodiment of a selectively switchable RF summer of FIG. 1 in a passive state of operation.
Figure 6:
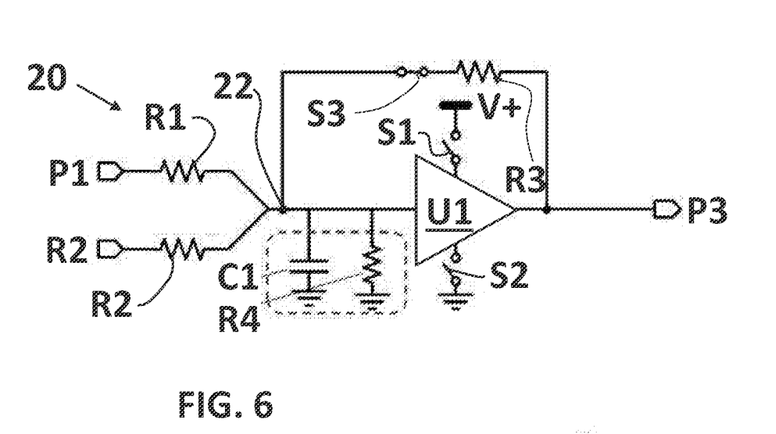
FIGS. 6 and 9 are simplified schematic diagrams of the embodiment of FIG. 1 in passive and active modes of operation, respectively, showing parasitic impedances of the amplifier.
Figure 7:
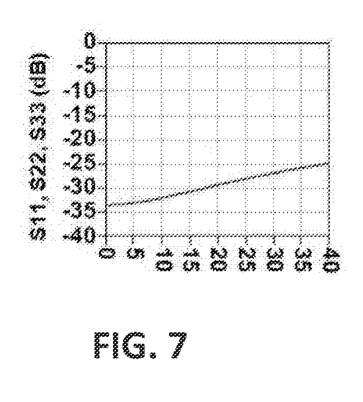
FIGS. 7 and 8 are graphs illustrating S-parameters as a function of frequency for the passive mode of operation of FIG. 6.
Figure 8:
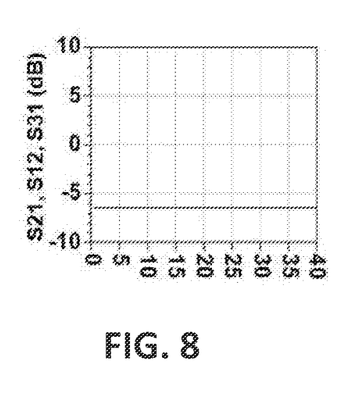

FIG. 2 illustrates the summer circuit 20 operable in a passive mode of operation. Such mode of operation is implemented by opening one or both of the first and second switches S1 and S2 and closing the third switch S3. First and second input signals provided to the first and second ports P1 and P2, respectively, are summed at the junction 22 and the summed signals are provided by the third switch S3 and the resistor R3 to the third port P3. The amplifier U1 presents a very high impedance at the input and output terminals (e.g., three times or greater with respect to the impedance $Z_0$) inasmuch as the amplifier U1 is off at such time. The circuit 20 is impedance matched at all three ports P1, P2, and P3, and exhibits an approximate −6 db signal transmission gain between all three ports P1, P2, and P3. Further, inasmuch as the components in the transmission path are substantially purely resistive, particularly when the switch S3 is manually or mechanically operable (thus eliminating parasitic impedance(s) of a transistor) operation in the passive mode is substantially linear over a very wide range of frequencies (e.g., 0-40 Ghz). The S-parameters for the circuit 20 operating in the passive mode are illustrated in FIGS. 7 and 8. FIG. 6 illustrates the circuit 20 of FIG. 2 with parasitic impedances of the buffer amplifier U1 represented by capacitor C1 and resistor R4. The S-parameters of FIGS. 7 and 8 are illustrated under the example that the characteristic impedance $Z_0$ is 50 ohms, the parasitic capacitor C1 has a capacitance of 20 femtofarads, and the parasitic resistance has a resistance of 500 ohms. Of course, as should be evident to one of ordinary skill in the art, the nature and values of parasitic impedances vary with the choice of components, particularly the buffer amplifier U1, and the scope of the claims appended hereto is not limited to the nature and value(s) of the parasitic impedances or to the component values as disclosed herein.

As seen in FIG. 7, the input port voltage reflection coefficients $S_{11}$ and $S_{22}$ and the output port voltage reflection coefficient $S_{33}$ rise with frequency between zero and 40 Ghz. because of the parasitic impedances. As seen in FIG. 8, the forward voltage gains $S_{31}$ and the parameters $S_{21}$ and $S_{12}$ remain constant at about −6 db as noted previously.

Figure 3:
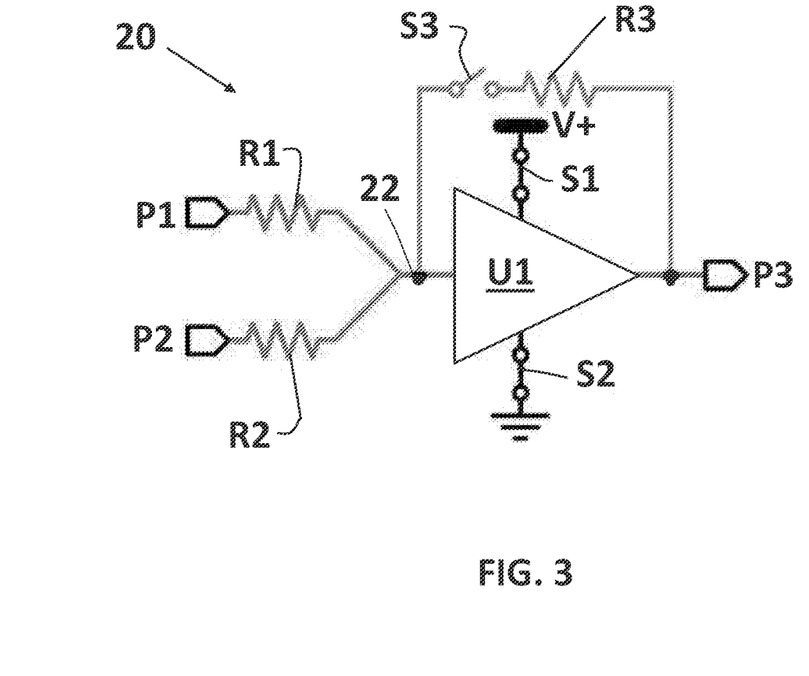
FIG. 3 is a simplified circuit diagram of the embodiment of a selectively switchable RF summer of FIG. 1 in an active state of operation.
Figures 9, 10:
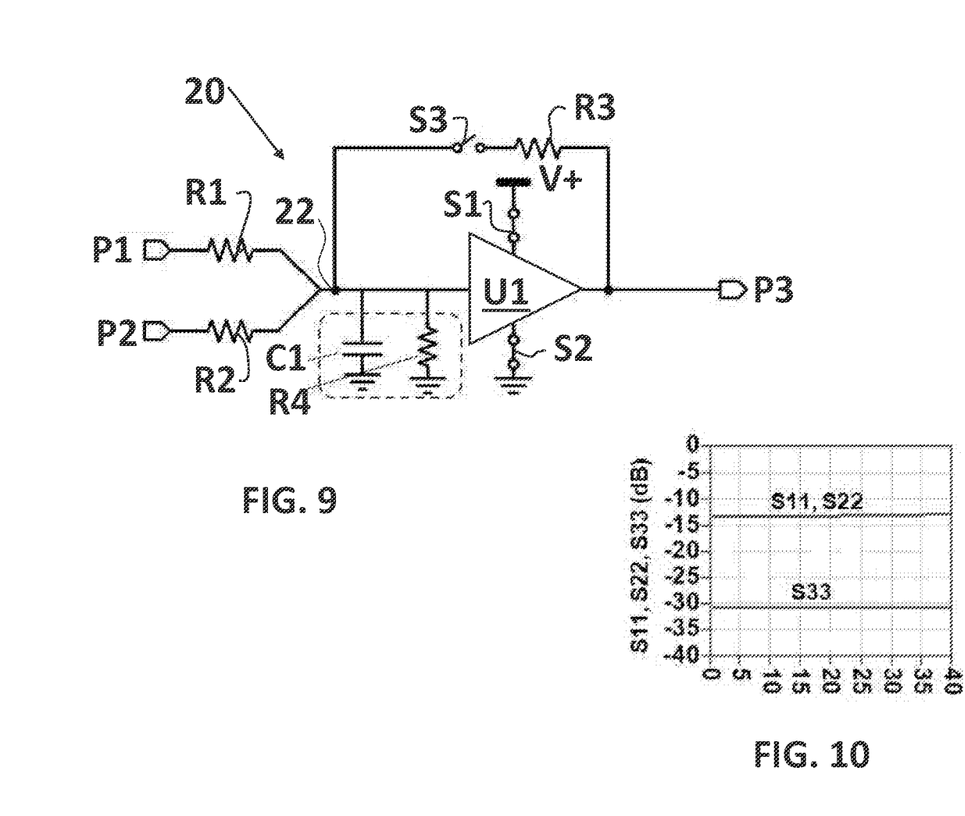
FIGS. 10 and 11 are graphs illustrating S-parameters as a function of frequency for the active mode of operation of FIG. 9.

Referring next to FIG. 3, the active mode of operation is initiated by closing the switches S1 and S2 and opening the switch S3. The amplifier U1 is thus energized (i.e., turned on) and the resistor R3 is removed from the circuit. As in the passive mode of operation, first and second input signals provided to the first and second ports P1 and P2, respectively, are summed at the junction 22. In the active mode of operation, the summed signals are amplified by the amplifier U1 and provided to the third port P3, with output impedance matching being undertaken by the amplifier U1. As seen in FIG. 9, exemplary parasitic impedances of the amplifier U1 comprising capacitor C1 and resistor R4 are shown, which may have the same or different values as the parasitic impedances shown in FIG. 6. The ports P1 and P2 remain partially matched to $Z_0$ due to each input signal at the ports P1 and P2 seeing the opposite port's impedance.

Figure 11:
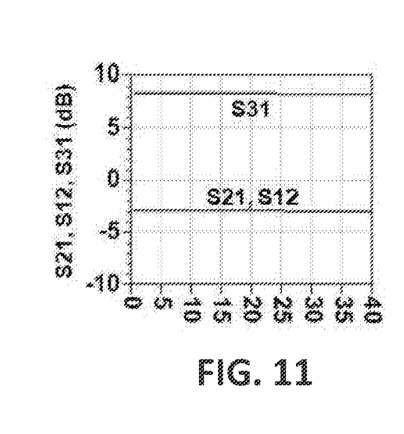

FIGS. 10 and 11 illustrate S-parameters during operation of the circuit 20 in the active mode. The input port voltage reflection coefficients $S_{11}$ and $S_{22}$ remain at approximately equal levels over the zero to 40 Ghz. bandwidth, as does the output port voltage reflection coefficient, albeit at a reduced level compared to the input port voltage reflection coefficients $S_{11}$ and $S_{22}$. The S-parameter $S_{31}$ remains substantially constant at an approximate level of 8 db over the bandwidth (although not shown in FIG. 11, the parameter $S_{32}$ is identical to the parameter $S_{31}$). The S-parameters $S_{21}$ and $S_{12}$ remain constant at about −3 db over the bandwidth.

Figure 4:
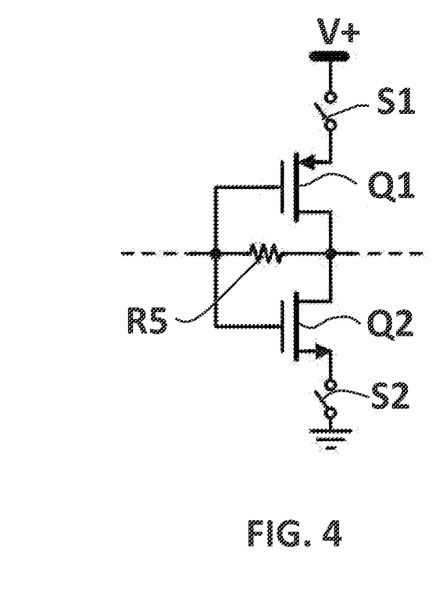
FIGS. 4 and 5 are schematic diagrams of two realizations of the amplifier of FIG. 1.
Figure 5:
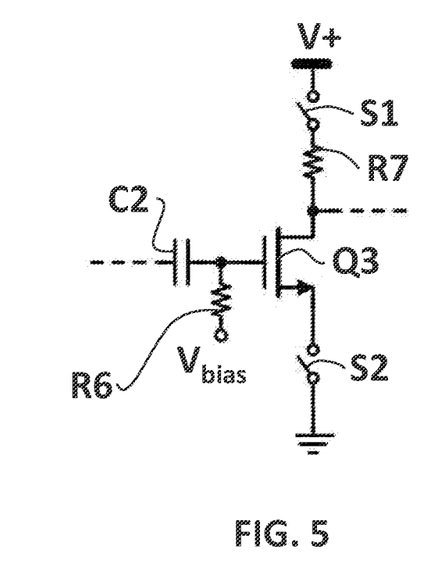

FIGS. 4 and 5 illustrate particular realizations of the amplifier U1 and associated switches S1 and S2, it being understood that other realization could be used in place thereof. The exemplary embodiment of FIG. 4 comprises P-channel and N-channel MOSFET's Q1 and Q2 having source and drain terminals connected in series between the switch S1 and the switch S2 and interconnected gate terminals. A resistor R5 is connected between the amplifier input terminal at the interconnected gate terminals and the output terminal at a junction between the drains of the transistors Q1 and Q2 to provide bias for proper operation.

The exemplary embodiment of FIG. 5 includes an N-channel MOSFET Q3 and a resistor R7 coupled to the drain terminal of the transistor Q3 at the amplifier output terminal. The series combination of the transistor Q3 and the resistor R7 is coupled to the switch S1. The source terminal of the transistor Q3 is optionally coupled by the switch S2 to ground. The switch S2 acts as a redundant method of turning off the amplifier U1. The small parasitic series resistance that the switch S2 exhibits when closed can be desirable to control amplifier gain and linearity. If the switch S2 is omitted the source terminal of the transistor Q3 is coupled directly to ground, thereby eliminating the small parasitic impedance. A gate terminal of the transistor Q3 is coupled to a junction between a series-connected combination of a capacitor C2 and the resistor R6. The series connected combination of the capacitor C2 and the resistor R6 is coupled between the amplifier input and a voltage $V_{bias}$. The capacitor C2 and resistor R6 provide the proper fixed DC gate voltage to bias the transistor Q3.

INDUSTRIAL APPLICABILITY

The embodiments disclosed herein can be used as a wideband gain-controlling feature in H-tree RF signal summing networks. Specific applications involve antenna feeds for phased-arrays and RF transversal filters. Signals in H-tree networks will either sum coherently, creating a large signal at the summed output port which can result in non-linear distortion for the amplifier at the summed output, or will sum incoherently causing a reduction in signal-to-noise ratio (SNR) at the output. Use of the switchable active-passive 2-way RF signal summer disclosed herein at each H-tree or other antenna feed output allows a circuit designer to select the passive mode of operation at ports where signals sum coherently or the active mode of operation at ports where signals sum incoherently. Thus, each signal level can be controlled individually at different summing tiers to balance noise and linearity performance.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar references in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Numerous modifications to the present disclosure will be apparent to those skilled in the art in view of the foregoing description. It should be understood that the illustrated embodiments are exemplary only, and should not be taken as limiting the scope of the disclosure.

We claim:

1. A radio frequency (RF) summer circuit having a characteristic impedance $Z_0$, comprising:
    first and second ports coupled by first and second resistances, respectively, to a junction and further comprising a third port at which a summed signal is developed;
    a series combination of a third resistance and a switch movable between open and closed positions; and
    an amplifier having input and output terminals and operable in an off state and an on state wherein the series combination has a first end coupled to the junction and to the input terminal and the series combination further has a second end coupled to the output terminal and wherein the output terminal is further coupled to a third port;
    wherein the first resistance, second resistance, and the third resistance are all substantially equal to $Z_0/3$; and
    wherein when the switch is moved to the closed position and the amplifier is switched to the off state a passive mode of operation is implemented and when the switch is moved to the open position and the amplifier is switched to the on state an active mode of operation is implemented and wherein the summed signal developed at the third port is equal to a sum of signals at the first and second ports modified by a first one of first and second gain values when the passive mode of operation is implemented and wherein the summed signal is equal to a sum of signals at the first and second ports modified by a second one of the first and second gain values when the active mode of operation is implemented.

2. The RF summer circuit of claim 1, wherein the summer circuit is impedance matched at all ports and has substantially equal gains between all ports when the passive mode of operation is implemented.

3. The RF summer circuit of claim 1, wherein a magnitude of the sum of signals is modified by the first gain value when the passive mode of operation is implemented.

4. The RF summer circuit of claim 1, wherein a magnitude of the sum of signals is modified by the second gain value when the active mode of operation is implemented.

5. The RF summer circuit of claim 1, wherein the first gain value comprises a negative value and a magnitude of the sum of signals is modified by the first gain value when the passive mode of operation is implemented and the second gain value comprises a positive value and a magnitude of the sum of signals is modified by the second gain value when the active mode of operation is implemented.

6. The RF summer circuit of claim 1, wherein the amplifier is switched between the off state and the on state by at least one further switch.

7. The RF summer circuit of claim 6, wherein the at least one further switch comprises two further switches and the amplifier comprises first and second MOSFET's having source and drain terminals coupled between the two further switches and gate terminals interconnected at the input terminal of the amplifier wherein a junction between the first and second MOSFET's comprises the output terminal of the amplifier and a resistor is coupled between the input terminal and output terminal.

8. The RF summer circuit of claim 6, wherein the amplifier comprises a MOSFET having a drain terminal coupled to the output terminal of the amplifier, a first resistor coupled between the at least one further switch and the output terminal of the amplifier and wherein a combination of a capacitor and second resistor is coupled between the input terminal of the amplifier and a voltage and a junction between the capacitor and the second resistor is coupled to a gate terminal of the MOSFET.

9. The RF summer circuit of claim 8, wherein a still further switch is coupled between a source terminal of the MOSFET and ground potential.

* * * * *